United States Patent
Kim et al.

(10) Patent No.: US 7,042,691 B2
(45) Date of Patent: May 9, 2006

(54) ELECTRICAL INERTIAL LOAD CONTROLLING APPARATUS HAVING GATE DRIVE FOR PROTECTING IGBT

(75) Inventors: Gil Dong Kim, Gunpo (KR); Young Jae Han, Seoul (KR); Hyun Jun Park, Seoul (KR); Sung Kyou Choi, Seoul (KR); Jung Min Cho, Cheongju (KR)

(73) Assignee: Korea Railroad Research Institute, Ulwang-Si (KR)

( * ) Notice: Subject to any disclaimer, the term of this patent is extended or adjusted under 35 U.S.C. 154(b) by 115 days.

(21) Appl. No.: 10/478,298

(22) PCT Filed: Dec. 24, 2001

(86) PCT No.: PCT/KR01/02258

§ 371 (c)(1),
(2), (4) Date: Mar. 1, 2004

(87) PCT Pub. No.: WO02/099972

PCT Pub. Date: Dec. 12, 2002

(65) Prior Publication Data

US 2004/0136131 A1    Jul. 15, 2004

(30) Foreign Application Priority Data

Jun. 2, 2001 (KR) ............................... 2001-31040

(51) Int. Cl.
*H02H 3/20* (2006.01)
*H02H 9/04* (2006.01)

(52) U.S. Cl. .................. 361/91.1; 361/56; 361/93
(58) Field of Classification Search .......... 361/91, 361/91.6, 111, 91.1, 56

See application file for complete search history.

(56) References Cited

U.S. PATENT DOCUMENTS

| | | | | |
|---|---|---|---|---|
| 5,852,538 A | * | 12/1998 | Masui | 361/18 |
| 5,946,178 A | * | 8/1999 | Bijlenga | 361/91.5 |
| 6,097,582 A | * | 8/2000 | John et al. | 361/79 |

* cited by examiner

*Primary Examiner*—Phuong T. Vu
*Assistant Examiner*—Dharti H. Patel
(74) *Attorney, Agent, or Firm*—Mayer, Brown, Rowe & Maw LLP

(57) ABSTRACT

The present invention provides a gate drive for protecting a switching element (IGBT) used for an electrical inertial load controller. A high-voltage IGBT is used as the switching element and an hcp1316j is used as the gate drive of the IGBT, to restrict overvoltage and overcurrent generated in the event of inverter switching, preventing destruction of the IGBT in advance. Furthermore, an RC filter is formed in close proximity to the IGBT to minimize an erroneous switching operation due to harmonics generated caused by noise in case of inverter switching to improve the system reliability and block an increase in abnormal voltage applied across the switching element.

4 Claims, 4 Drawing Sheets

Behavioral Circuit Schematic

Behavioral Circuit Schematic

ELECTRICAL INERTIAL LOAD CONTROLLING APPARATUS HAVING GATE DRIVE FOR PROTECTING IGBT

This is a nationalization of PCT/KR01/02258 filed Dec. 24, 2001 and published in English.

1. Technical Field

The present invention generally relates to a gate drive and, more particularly, to a gate drive of a large-capacity switching device used for an electrical inertial load controlling apparatus.

2. Background Art

One of the essential elements for constructing an electronic circuit system is the inverter serving as a switch. The principal points in constitution of the inverter are techniques for designing and manufacturing a gate drive. This gate drive designing technique belongs to the electric power electronic field and employs a method of increasing a gate resistance or restricting overcurrent using a zener diode in the event of turn-off due to overcurrent or short-circuiting.

In general, the drive circuit of the switch used for the electrical inertial load controller must operate in the environment where very strong noise exists because a power converter should switches electric power. However, it is required that the noise does not affect the operation of the controller. To solve the influence of the noise, accordingly, a cable for optical communication is used as a device varying with large power to electrically separate the controller and gate drive from each other.

The electrical inertial load controller conventionally employs a high-voltage IGBT (Isolation gate bipolar transistor) as its switching element. A conventional gate drive for protecting this IGBT includes a photo-coupler operating by a signal applied from the outside, a pre-amplifier for amplifying the signal outputted from the photo-coupler, and a second drive driven by the signal amplified by the pre-amplifier.

The photo-coupler is constructed in a manner that a light-emitting device and a light-receiving device are contained in a single package to transmit signals through the medium of rays of light. Specifically, the photo-coupler converts an electric signal into an optical signal with the help of a light-emitting diode to transmit it, and restores a received optical signal into an electric signal using a phototransistor. The photo-coupler electrically isolates input and output from each other. The pre-amplifier, placed in front of a main amplifier, amplifies a small output signal to some degree and reduces noise.

However, the aforementioned gate drive of the high-voltage IGBT is currently being imported in high price, and its circuit configuration is complicated. In addition, the IGBT may be destroyed due to overvoltage or overcurrent generated in the event of inverter switching, to deteriorate the reliability of the entire system.

DISCLOSURE OF INVENTION

It is, therefore, an object of the present invention to provide a gate drive that effectively blocks overvoltage or overcurrent generated in the event of inverter switching of an electrical inertial load controller to prevent destruction of IGBT serving as a switch.

Another object of the present invention is to provide a gate drive of IGBT that minimizes generation of harmonics caused by noise in the event of inverter switching of an electrical inertial load controller.

A further object of the present invention is to provide a gate drive of IGBT that reduces manufacturing costs.

To accomplish the objects of the present invention, there is provided an electrical inertial load controller comprising an IGBT serving as a switch, an hcp1316j device serving as a gate drive for driving the IGBT, and an RC filter, formed in close proximity to the IGBT, for preventing an erroneous switching operation due to harmonics generated caused by noise in the event of switching of the IGBT and appropriately controlling the turn-on and turn-off time of the IGBT to reduce overvoltage applied across the IGBT in case of switching operation.

BRIEF DESCRIPTION OF THE DRAWINGS

Further objects and advantages of the invention can be more fully understood from the following detailed description taken in conjunction with the accompanying drawings, in which.

BEST MODE FOR CARRYING OUT THE INVENTION

The present invention will now be described in connection with preferred embodiments with reference to the accompanying drawings.

Figure 1:
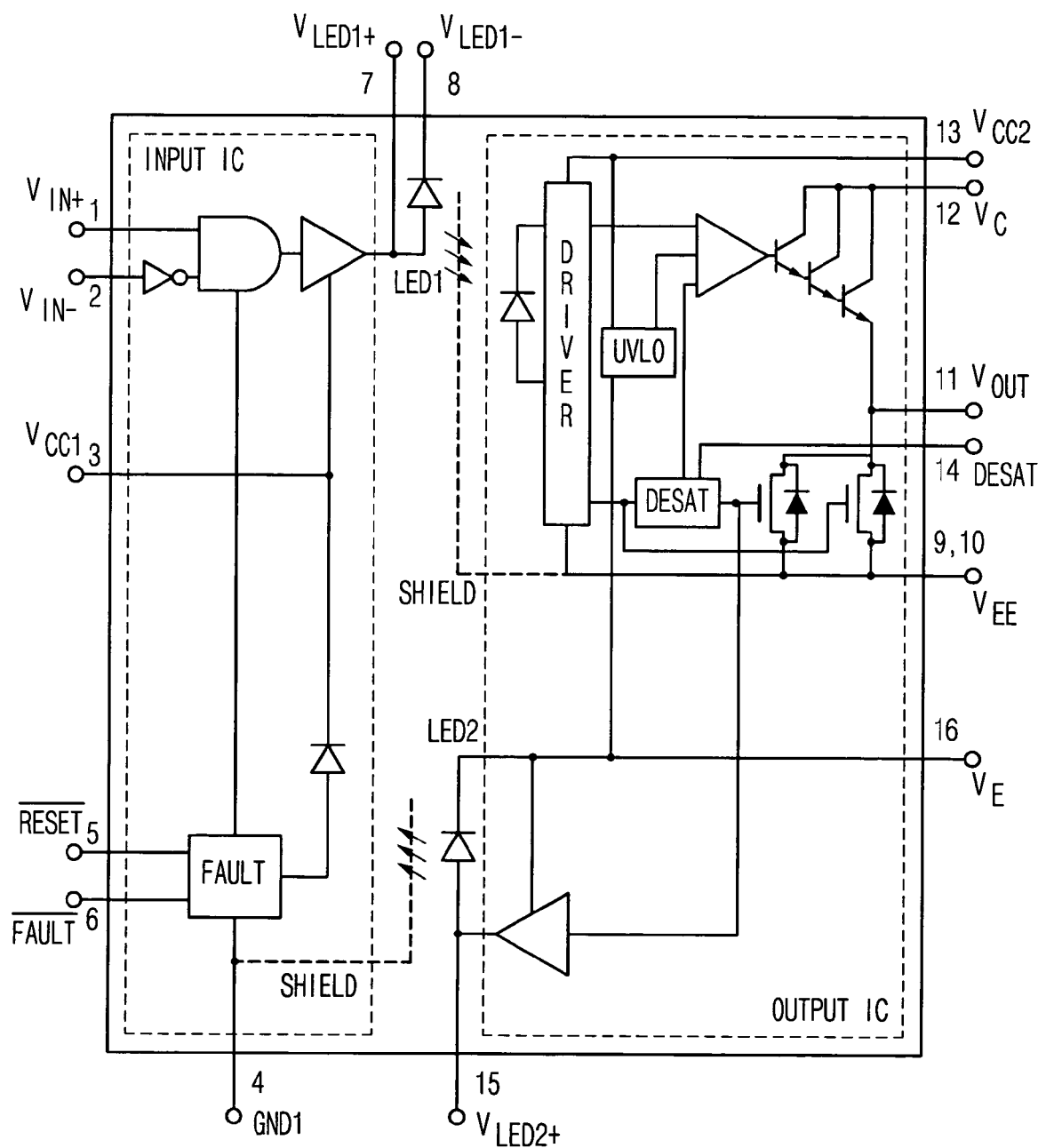
FIG. 1 is a block diagram of an hcp1316j applied to the present invention.

FIG. 1 is a block diagram of an hcp1316j applied to the present invention.

In the present invention, the hcp1316j shown in FIG. 1 is used as a gate drive. This hcp1316j prevents damages in devices and isolates a processor and a power converter from each other, through its overcurrent soft turn-off function and imperfect operation of an output gate signal due to low voltage.

In the present invention, in addition, to prevent erroneous operations caused by a variety of noises generated in the gate signal of the IGBT and signal lines between devices, an RC filter is set in close proximity to the IGBT. Specifically, the RC filter is being inserted between the base and emitter of the IGBT to remove noise transmitted through the gate signal line, thereby preventing an erroneous switching operation. Furthermore, the RC filter appropriately controls the turn-on and turn-off time of the IGBT to reduce overvoltage applied across the switch in the event of switching thereof so that the dielectric strength of the device can be designed in lower value, decreasing manufacturing cost.

Figure 2:
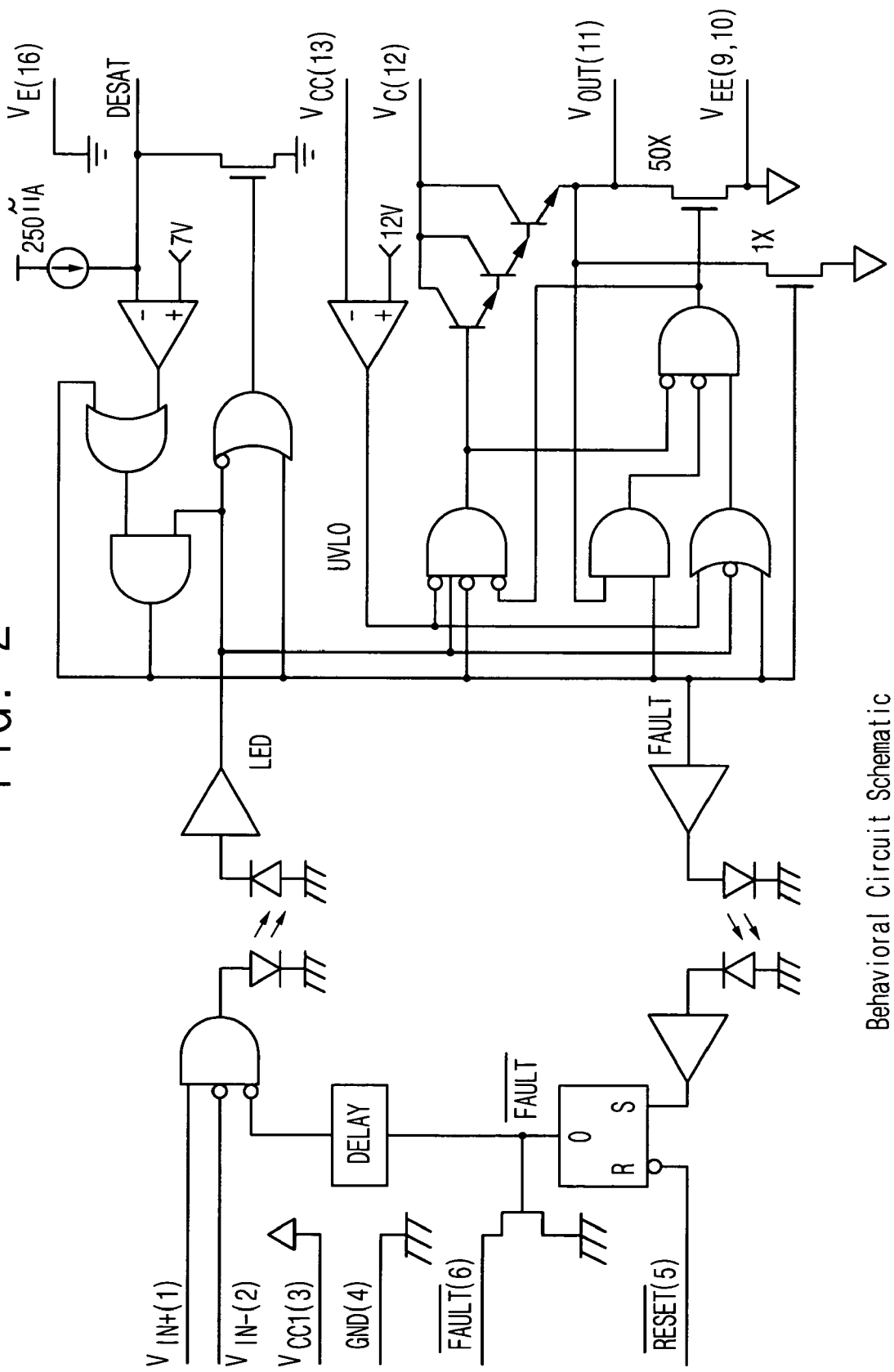
FIG. 2 is a circuit diagram of the hcp1316j applied to the present invention.

FIG. 2 is a circuit diagram of the hcp1316j applied to the present invention. Referring to FIG. 2, pins 1 and 2 are parts to which control signals VIN+ and VIN− for switching are inputted. These signals are transmitted to a secondary side through optical signals as long as a fault signal is not outputted. A pin 13 designating a port Vcc2 is compared with 12V to control an output signal in order not to output the control signals to the IGBT in case of an under voltage of below 12V that is the minimum voltage capable of turning on a power switch safely.

Figure 3:
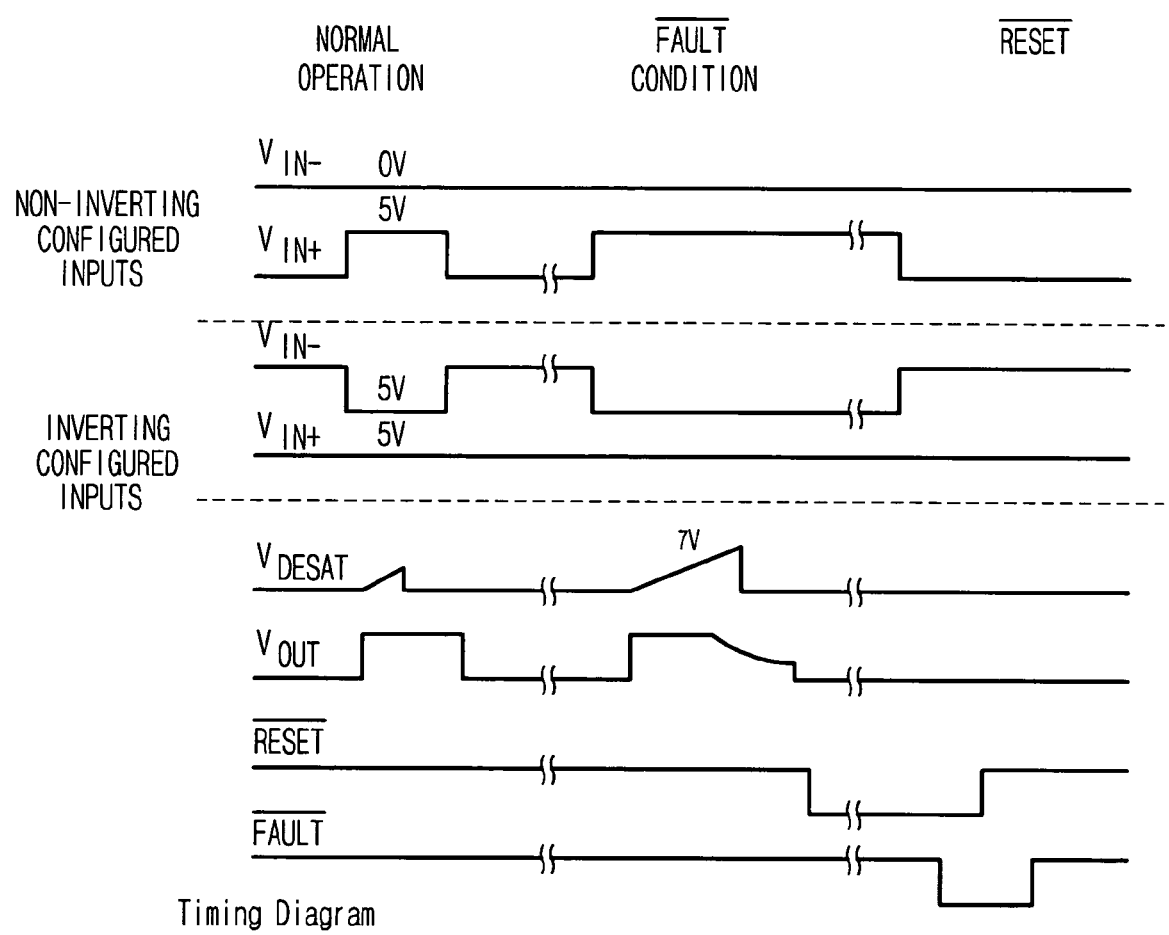
FIG. 3 shows control timing signals of the hcp1316j applied to the present invention.

A pin 14 indicating a port DESAT is connected to the power switch, that is, the collector of the IGBT, and a pin 16 designating a port VE is connected to its emitter so that a voltage drop in the switch is increased when current flows through the IGBT, raising the voltage of the port DESAT 14. Here, when the voltage drop caused by overcurrent increases by 7V or more, the switch is turned off to protect the device. However, if hard turn-off is carried out for the switch, abnormal overvoltage is generated to destroy the IGBT. Thus, it is preferable that the IGBT is turned off with a predetermined delay time, as shown in FIG. 3.

Figure 4:
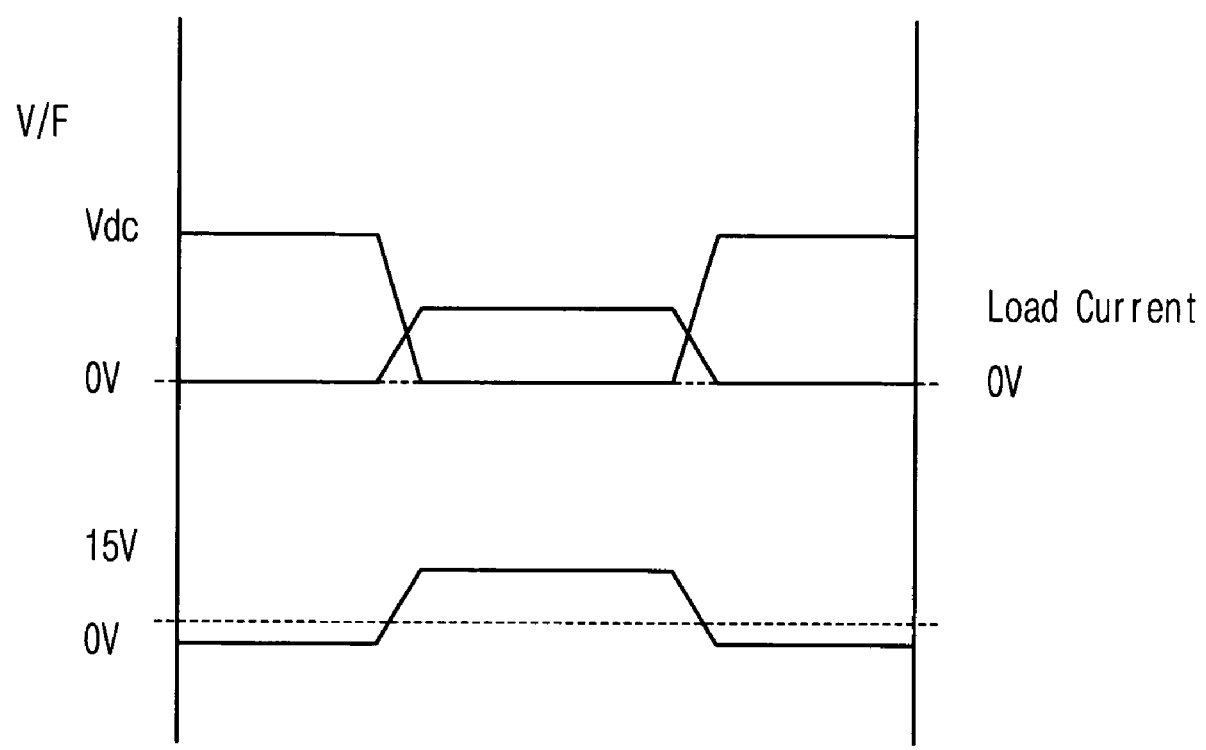
FIG. 4 shows voltage and current gate signals appearing across a switch when the rising time and falling time of a switching signal were controlled using an RC filter.

FIG. 4 shows voltage and current gate signals appearing across the switch when the rising time and falling time of a switching signal were controlled using the RC filter. As shown in FIG. 4, the rising time and falling time of the gating signal are properly adjusted to prevent an increase in abnormal voltage.

As described above, the present invention uses the high-voltage IGBT as a switch of an electrical inertial load controller to restrict a trouble that may be generated in the gate drive, that is, overvoltage and overcurrent created in case of inverter switching, to prevent destruction of the IGBT in advance. Furthermore, the invention minimizes erroneous switching operation due to generation of harmonics caused by noise in the event of inverter switching to improve the system reliability and to block an increase in abnormal voltage across the switch, generated in case of switching operation.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. An electrical inertial load controller having a gate drive for protecting an IGBT, comprising:
   an IGBT serving as a switch;
   an IGBT protection device serving as the gate drive for driving the IGBT, wherein control signals inputted into the IGBT protection device are transmitted optically to a secondary side of the IGBT protection device; and
   an RC filter, formed in close proximity to the IGBT, for preventing an erroneous switching operation due to harmonics generated caused by noise in the event of switching of the IGBT and appropriately controlling the turn-on and turn-off time of the IGBT to reduce overvoltage applied across the IGBT in case of switching operation.

2. The electrical inertial load controller as claimed in claim 1, wherein the RC filter is inserted between the base and collector of the IGBT.

3. A system for protecting an IGBT, comprising:
   an IGBT serving as a switch;
   an IGBT protection device serving as the gate drive for driving the IGBT, wherein control signals inputted into the IGBT protection device are transmitted optically to a secondary side of the IGBT protection device if a fault signal is not output; and
   an RC filter, formed in close proximity to the IGBT, for preventing an erroneous switching operation due to harmonics generated caused by noise in the event of switching of the IGBT and appropriately controlling the turn-on and turn-off time of the IGBT to reduce overvoltage applied across the IGBT in case of switching operation.

4. The system as claimed in claim 1, wherein the RC filter is inserted between the base and collector of the IGBT.

* * * * *